United States Patent
Yin et al.

(10) Patent No.: US 11,823,849 B2
(45) Date of Patent: Nov. 21, 2023

(54) EFFICIENT AND STABLE INORGANIC LEAD-FREE PEROVSKITE SOLAR CELL AND METHOD FOR PREPARING THE SAME

(71) Applicant: Shandong University, Jinan (CN)

(72) Inventors: Longwei Yin, Jinan (CN); Bo Li, Jinan (CN)

(73) Assignee: Shandong University, Jinan (CN)

( * ) Notice: Subject to any disclaimer, the term of this patent is extended or adjusted under 35 U.S.C. 154(b) by 119 days.

(21) Appl. No.: 17/528,145

(22) Filed: Nov. 16, 2021

(65) Prior Publication Data
US 2022/0172904 A1  Jun. 2, 2022

(30) Foreign Application Priority Data
Nov. 17, 2020 (CN) .......................... 202011282501.5

(51) Int. Cl.
*H01G 9/20* (2006.01)
*H10K 30/10* (2023.01)
*H10K 71/12* (2023.01)
*H10K 85/10* (2023.01)

(52) U.S. Cl.
CPC ......... *H01G 9/2009* (2013.01); *H01G 9/2031* (2013.01); *H10K 30/10* (2023.02); *H10K 71/12* (2023.02); *H10K 85/111* (2023.02); *H10K 85/1135* (2023.02)

(58) Field of Classification Search
CPC .... H01G 9/2009; H01G 9/2031; H10K 30/10; H10K 85/1135; H10K 85/111
See application file for complete search history.

(56) References Cited

U.S. PATENT DOCUMENTS 9,793,056 B1 * 10/2017 Bag .................. H10K 85/1135
9,966,195 B1 *  5/2018 Bag .................. H10K 85/1135

FOREIGN PATENT DOCUMENTS

WO  WO-2020209916 A2 * 10/2020 ........... H01L 51/448

OTHER PUBLICATIONS

Ye et al, A Breakthrough Efficiency of 19.9% Obtained in Inverted PerovskiteSolar Cells by Using an Efficient Trap State Passivator Cu(thiourea)I, J.Am.Chem.Soc. 2017, 139, 7504-7512 (Year: 2017).*
Patil et al, A thiourea additive-based quadruple cation lead halide perovskite with an ultra-large grain size for efficient perovskite solar cells, Nanoscale, 2019, 11, 21824 (Year: 2019).*
Zhang et al, Perovskite Photovoltaics: The Significant Role of Ligands in Film Formation, Passivation, and Stability, Adv. Mater. 2019, 31, 1805702 (Year: 2019).*
Li et al, Passivation of defects in perovskite solar cell: From a chemistry point of view, Nano Energy vol. 77, Nov. 2020, 105237 (Year: 2020).*

* cited by examiner

*Primary Examiner* — Andrew J Golden
(74) *Attorney, Agent, or Firm* — Fish IP Law, LLP

(57) ABSTRACT

The disclosure provides an efficient and stable inorganic lead-free perovskite solar cell and a method for preparing the same. The solar cell includes a conductive substrate, a PEDOT: PSS layer, an inorganic lead-free $CsSnI_3$ perovskite layer, a C60 layer, a BCP layer, and a metal counter electrode layer arranged in order from bottom to top, wherein the inorganic lead-free $CsSnI_3$ perovskite layer is a $CsSnI_3$ perovskite layer passivated by a thioureas small-molecule organic compound.

10 Claims, 5 Drawing Sheets

EFFICIENT AND STABLE INORGANIC LEAD-FREE PEROVSKITE SOLAR CELL AND METHOD FOR PREPARING THE SAME

CROSS REFERENCE TO RELATED APPLICATION

This application claims the benefit and priority of Chinese patent application no. 202011282501.5 filed on Nov. 17, 2020, the disclosure of which is incorporated by reference herein in its entirety as part of the present application.

TECHNICAL FIELD

The present disclosure relates to an efficient and stable inorganic lead-free perovskite solar cell and a method for preparing the same, and belongs to the technical field of material synthesis and photoelectric conversion.

BACKGROUND ART

In recent years, organic-inorganic hybrid perovskite solar cells have become an emerging photovoltaic technology due to their excellent photovoltaic performance and low manufacturing cost. However, the toxicity of lead ions in efficient organic-inorganic perovskite materials is still a major obstacle on the road to commercialization of perovskite batteries. Tin and lead are elements of the same main group, and tin-based perovskite and lead-based perovskite have similar optical properties. Among all currently reported non-lead-based perovskite solar cells, tin-based perovskite solar cells have the best photoelectric performance Therefore, it is very important for the commercialization of perovskite cells to develop environmentally friendly tin-based perovskite solar cells.

In the tin-based perovskite materials, the all-inorganic $CsSnI_3$ has a stable crystal structure, ideal direct band gap (1.3 eV), ultra-low exciton binding energy (18 meV) and excellent light absorption coefficient ($10^4$ cm$^{-1}$). However, compared with organic-inorganic hybrid tin-based perovskite ($MASnI_3$ and $FASnI_3$) batteries, the all-inorganic $CsSnI_3$ solar cells have a lower photoelectric conversion efficiency, which is only about 5%. Previous studies have shown that the divalent tin ions on the surface of the all-inorganic $CsSnI_3$ perovskite crystal will induce a large number of deep level defects. Therefore, in order to improve the photovoltaic performance of inorganic lead-free perovskite solar cells, it is urgent to adopt effective methods to passivate surface defects.

SUMMARY

In view of the deficiencies in the prior art, the present disclosure provides an efficient and stable inorganic lead-free perovskite solar cell and a method for preparing the same. In the present disclosure, a thioureas small-molecule organic compound is used as a surface passivator of $CsSnI_3$ perovskite to construct a perovskite solar cell with a trans structure (a conductive substrate/a PEDOT: PSS layer/an inorganic lead-free $CsSnI_3$ perovskite layer/a C60 layer/a BCP layer/a metal counter electrode layer); as a result, the obtained solar cell has a greatly improved photoelectric conversion efficiency, and a good long-term working stability.

Term description:
PEDOT: PSS: poly (3,4-ethylenedioxythiophene)-poly (styrene sulfonate) aqueous solution;
C60: fullerene;
BCP: bathocuproine.

The present disclosure provides the following technical solutions:

An efficient and stable inorganic lead-free perovskite solar cell, comprising a conductive substrate, a PEDOT: PSS layer, an inorganic lead-free $CsSnI_3$ perovskite layer, a C60 layer, a BCP layer, and a metal counter electrode layer arranged in order from bottom to top, wherein the inorganic lead-free $CsSnI_3$ perovskite layer is a $CsSnI_3$ perovskite layer passivated by a thioureas small-molecule organic compound.

In some embodiments, the conductive substrate is an ITO conductive glass substrate, i.e. indium tin oxide conductive glass substrate.

In some embodiments, the conductive substrate has an electrical resistance of less than 6 ohm/sq, and a thickness of 140-160 nm.

In some embodiments, the PEDOT: PSS layer has a thickness of 20-40 nm.

In some embodiments, the inorganic lead-free $CsSnI_3$ perovskite layer has a thickness of 400-500 nm.

In some embodiments, the thioureas small-molecule organic compound is selected from the group consisting of thiourea, thiosemicarbazide, and thioacetamide.

In some embodiments, the inorganic lead-free $CsSnI_3$ perovskite layer is prepared by a process including:
sequentially depositing $SnI_2$, the thioureas small-molecule organic compound, and CsI on the PEDOT: PSS layer, and then annealing to obtain an inorganic lead-free $CsSnI_3$ perovskite layer.

In some embodiments, the C60 layer has a thickness of 30-50 nm.

In some embodiments, the BCP layer has a thickness of 5-10 nm.

In some embodiments, a metal counter electrode in the metal counter electrode layer is copper counter electrode or gold counter electrode, and the metal counter electrode layer has a thickness of 50-70 nm.

A method for preparing the efficient and stable inorganic lead-free perovskite solar cell described in above technical solution, comprising the following steps:

(1) pretreating a conductive substrate;

(2) spin-coating a PEDOT: PSS aqueous solution on the conductive substrate, and annealing at a high temperature to obtain a PEDOT: PSS layer;

(3) using $SnI_2$, the thioureas small-molecule organic compound and CsI as raw materials, sequentially depositing $SnI_2$, the thioureas small-molecule organic compound, and CsI on the PEDOT: PSS layer by a vacuum thermal evaporation, and then annealing to obtain an inorganic lead-free $CsSnI_3$ perovskite layer; and (4) sequentially depositing a C60 layer, a BCP layer and a metal counter electrode layer on the inorganic lead-free $CsSnI_3$ perovskite layer by a vacuum thermal evaporation, to obtain an inorganic lead-free perovskite solar cell.

In some embodiments, in step (1), the conductive substrate is pretreated as follows: etching, washing, and drying the conductive substrate, and finally subjecting the conductive substrate to an ultraviolet ozone treatment.

In some embodiments, the etching is conducted by partially etching a conductive surface of the conductive substrate, and particularly by a process comprising:

dropwise adding a dilute hydrochloric acid with a concentration of 1-3 mol/L to a surface of the conductive substrate covered with zinc powder at ambient temperature, and reacting for 3-8 min to complete the etching. In some embodiments, the washing is conducted by ultrasonically cleaning the etched conductive substrate in a cleaning agent, acetone and ethanol in sequence at ambient temperature, 10-30 min for each cleaning material. In some embodiments, the ultraviolet ozone treatment is conducted at ambient temperature for 10-30 min.

In some embodiments, in step (2), the PEDOT: PSS aqueous solution is spin coated on the conductive substrate using a spin coater at a spin-coating speed of 2000-3000 rpm for 30-40 s.

In some embodiments, in step (2), the PEDOT: PSS aqueous solution is commercially available, and has a concentration of 1.3-1.7 wt %.

In some embodiments, in step (2), the annealing is conducted at a high temperature of 80-120° C. for 5-15 min.

In some embodiments, in step (3), the vacuum thermal evaporation is conducted at a vacuum degree of less than $1 \times 10^{-5}$ Pa, during which $SnI_2$ is evaporated at a heating temperature of 300-350° C. and an evaporation rate of 0.1-0.2 nm/s, the thioureas small-molecule organic compound is evaporated at a heating temperature of 70-100° C. and an evaporation rate of 0.1-0.2 nm/s, and CsI is evaporated at a heating temperature of 550-600° C. and an evaporation rate of 0.2-0.5 nm/s.

In some embodiments, in step (3), a molar ratio of CsI to $SnI_2$ is in a range of 1:(1-1.3), a molar ratio of the thioureas small-molecule organic compound to CsI is in a range of 1:(45-55), a molar ratio of CsI to $SnI_2$ is 1:1.2, and a molar ratio of the thioureas small-molecule organic compound to CsI is 1:50.

In some embodiments, in step (3), CsI has a purity of 99.9%, and $SnI_2$ has a purity of 99.99%.

In some embodiments, in step (3), the annealing is conducted at a temperature of 120-140° C. for 10-20 min.

In some embodiments, step (4) is conducted as follows: under a vacuum degree of less than $1 \times 10^{-5}$ Pa, evaporating C60 at an evaporation rate of 0.1-0.3 nm/s, preferably 0.2 nm/s, and depositing on the inorganic lead-free $CsSnI_3$ perovskite layer to obtain a C60 layer; then evaporating BCP at an evaporation rate of 0.05-0.3 nm/s, preferably 0.1 nm/s, and depositing on the C60 layer to obtain a BCP layer; finally evaporating a metal at an evaporation rate of 0.2-0.7 nm/s, preferably 0.5 nm/s, and depositing on the BCP layer to obtain an inorganic lead-free perovskite solar cell.

The present disclosure has the following technical features and beneficial effects:

1. The vacuum thermal evaporation used in the present disclosure could effectively improve the film and crystal defects caused by the different chemical reaction rates of the perovskite precursors.

2. The thioureas small-molecule organic compound used in the present disclosure contains S=CN functional groups, which have strong coordination with tin ions on the surface of perovskite crystals, thus increasing surface electron cloud density, increasing vacancy formation energy, reducing the density of deep-level trap states caused by oxidation of surface unsaturated tin ions and divalent tin, inhibiting non-radiative recombination of perovskites, and increasing lifetime of carriers.

3. In the present disclosure, the thioureas small-molecule organic compound needs to be used in an appropriate amount; because excessive amount of the thioureas small-molecule organic compound will cause a failure of forming $CsSnI_3$ perovskite, while too little amount of the thioureas small-molecule organic compound will have no effect. The evaporation and deposition of the thioureas small-molecule organic compound in the present disclosure needs to be carried out after the evaporation and deposition of $SnI_2$ and before the evaporation and deposition of CsI, and the above order of evaporation and deposition cannot be changed, otherwise the $CsSnI_3$ perovskite of the present disclosure will not be obtained. The annealing involved in the process of preparing the $CsSnI_3$ perovskite layer of the present disclosure needs to be conducted at an appropriate temperature; too low temperature will lead to insufficient reaction of the perovskite precursor, and too high temperature will destroy the PEDOT: PSS in the lower layer.

4. In the inorganic lead-free perovskite solar cell according to the present disclosure, the crystal surface defects are effectively passivated, which greatly improves the photoelectric conversion efficiency, up to 8.20%. The inorganic lead-free perovskite solar cell exhibits a good long-term working stability, and could still maintain about 90% of the initial photoelectric conversion efficiency after testing for 500 h.

DETAILED DESCRIPTION OF THE EMBODIMENTS

Figure 1:
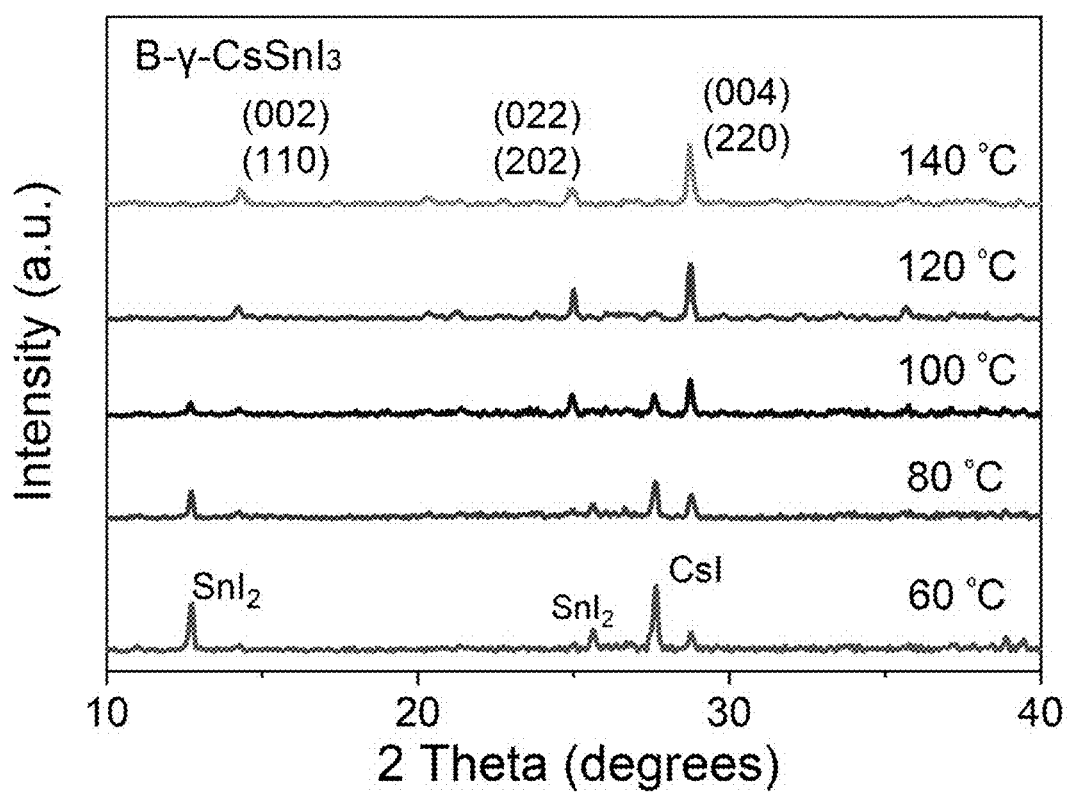
FIG. 1 is a diagram showing X-ray diffraction (XRD) patterns of the inorganic lead-free $CsSnI_3$ perovskite layers prepared in Example 1, Example 5 and Comparative Examples 1-3 of the present disclosure.

The present disclosure will be further illustrated below through specific examples, but it is not limited thereto.

The raw materials used in examples, unless otherwise specified, are conventional raw materials, which are commercially available; the methods used in the examples, unless otherwise specified, are all prior art.

In the examples, the ITO conductive glass used has a resistance of less than 6 ohm/sq.

EXAMPLE 1

A method for preparing an efficient and stable inorganic lead-free perovskite solar cell is conducted as follows:

(1) A conductive surface of an ITO conductive glass was partially etched by an etching process as follows: a dilute hydrochloric acid with a concentration of 2 mol/L was added to a surface of the ITO glass with a half of the surface covered with zinc powder at ambient temperature, and then reacted for 5 min; after that, the etching was completed. Then, the partially etched ITO glass was ultrasonically cleaned in a cleaning agent, acetone and ethanol in sequence at ambient temperature, 20 min for each cleaning material. The cleaned ITO glass was dried, and then placed in an ultraviolet-ozone processor and treated at ambient temperature for 30 min, obtaining an ITO conductive glass substrate with a thickness of 150 nm.

(2) 100 μL of PEDOT: PSS conductive coating (with a concentration of 1.3-1.7%) was spin-coated on the ITO conductive glass substrate by a spin coater at a speed of 3000 rpm for 30 s, then placed on a hot plate with a temperature 100° C. and heated in air for 10 min, obtaining a PEDOT: PSS layer with a thickness of 30 nm.

(3) The three precursors, i.e. 1.2 mmol of $SnI_2$ (with a purity of 99.99%), 0.02 mmol of thiosemicarbazide and 1 mmol of CsI (with a purity of 99.9%), were respectively placed in three evaporation chambers of a vacuum thermal evaporation equipment, and under a pressure of less than $1\times10^{-5}$ Pa, $SnI_2$ was firstly evaporated at a heating temperature of 350° C. and an evaporation rate of 0.2 nm/s until $SnI_2$ was exhausted, thiosemicarbazide was then evaporated at a heating temperature of 100° C. and an evaporation rate of 0.2 nm/s until thiosemicarbazide was exhausted, and finally, CsI was evaporated at a heating temperature of 600° C. and an evaporation rate of 0.5 nm/s until CsI was exhausted. The deposited product was transferred from the vacuum thermal evaporation equipment to a heating plate, and annealed at a temperature of 120° C. for 15 min, obtaining an inorganic lead-free $CsSnI_3$ perovskite layer with a thickness of 500 nm.

(4) Finally, the sample prepared in step (3) was placed in a vacuum thermal evaporation chamber, and under a pressure in the evaporation chamber of lower than $1\times10^{-5}$ Pa, C60 was evaporated at an evaporation rate of 0.2 nm/s and deposited on the inorganic lead-free $CsSnI_3$ perovskite layer, obtaining a C60 layer with a thickness of 40 nm, BCP was then evaporated at an evaporation rate of 0.1 nm/s and deposited on the C60 layer, obtaining a BCP layer with a thickness of 8 nm, and finally Cu was evaporated at an evaporation rate of 0.5 nm/s and deposited on the BCP layer, obtaining a Cu counter electrode layer with a thickness of 60 nm, thus obtaining an inorganic lead-free perovskite solar cell.

Figure 2:
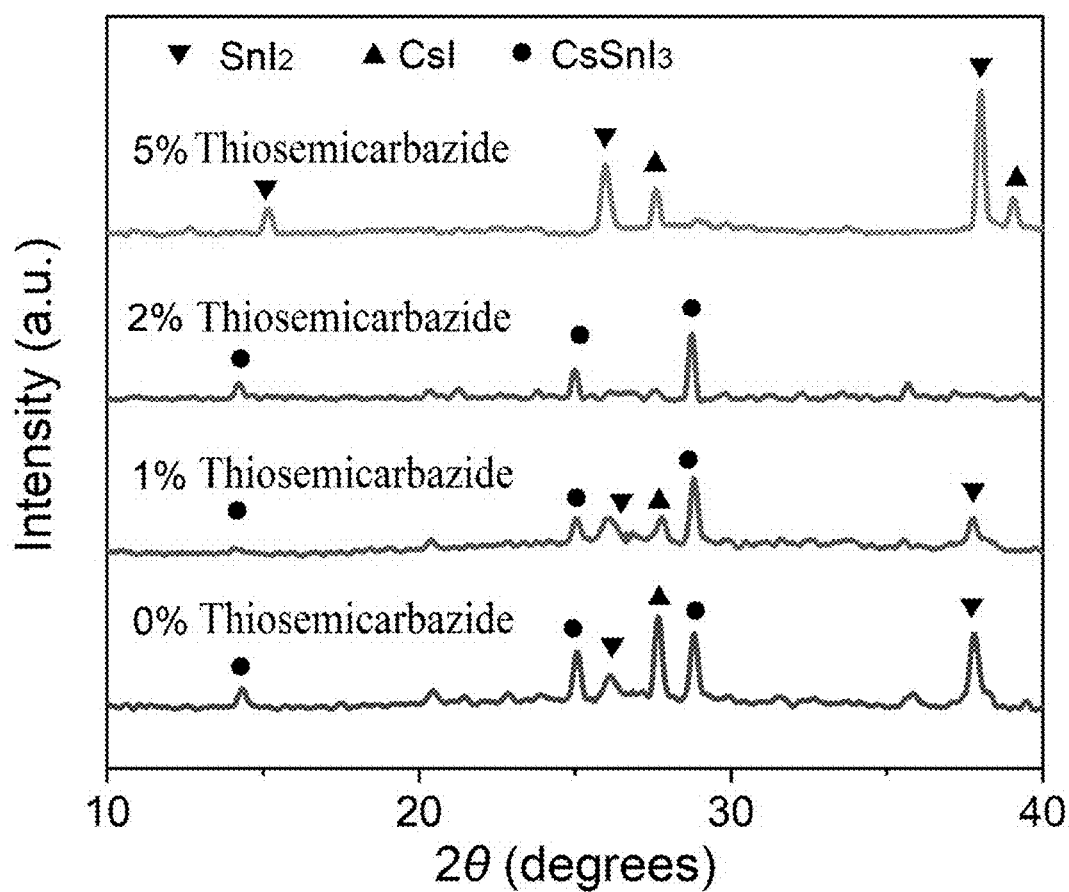
FIG. 2 is a diagram showing XRD patterns of the inorganic lead-free $CsSnI_3$ perovskite layers prepared in Example 1 and Comparative Examples 4-5 of the present disclosure.

XRD patterns of the inorganic lead-free $CsSnI_3$ perovskite layer prepared in step (3) of this example are shown in FIG. 1 and FIG. 2. It can be seen from FIG. 1 that as the annealing temperature increases, the diffraction peaks of the precursors CsI and $SnI_2$ gradually weaken, while the diffraction peaks of $CsSnI_3$ gradually increase; moreover, the prepared inorganic lead-free $CsSnI_3$ perovskite shows B-γ-$CsSnI_3$ perovskite crystal phase. It can be seen from FIG. 2 that the inorganic lead-free $CsSnI_3$ perovskite with an addition of 2% thiosemicarbazide (percentage of a molar amount of thiosemicarbazide accounts for the molar amount of $CsSnI_3$, i.e. the molar amount of CsI) is the most fully reacted and shows the best crystal structure.

Figure 3:
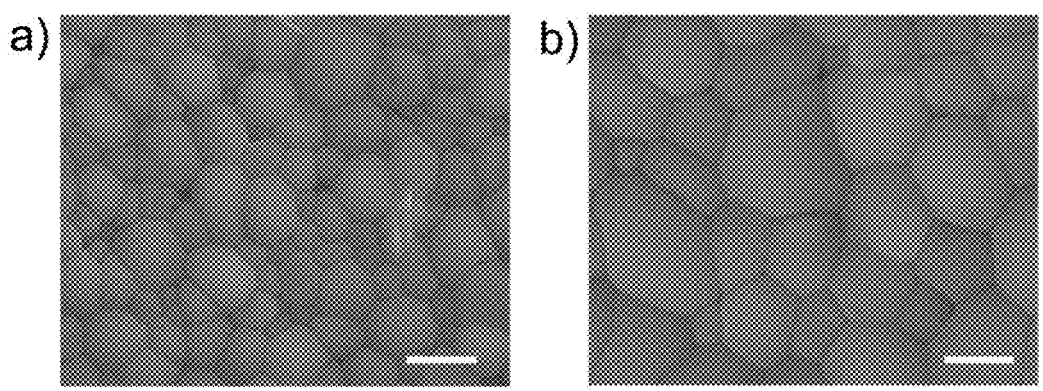
FIG. 3 shows scanning electron microscope (SEM) images of the inorganic lead-free $CsSnI_3$ perovskite layers prepared in Example 1 (panel b) and Comparative Example 4 (panel a) of the present disclosure, in which the panels have a scale length of 500 nm.

An SEM image of the inorganic lead-free $CsSnI_3$ perovskite layer prepared in step (3) of this example is shown in FIG. 3. It can be seen from FIG. 3 that the inorganic lead-free $CsSnI_3$ perovskite added with thiosemicarbazide shows an increased grain size, which is about 500 nm.

Figure 4:
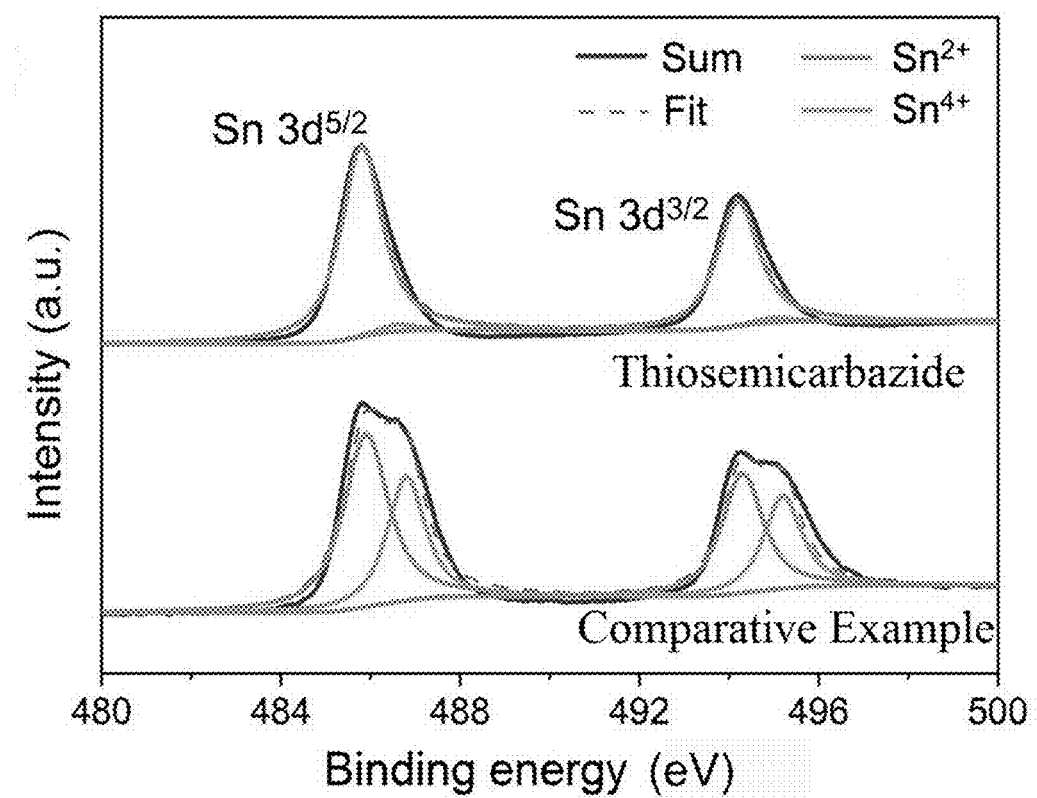
FIG. 4 is a diagram showing X-ray photoelectron spectroscopy (XPS) patterns of element Sn of the inorganic lead-free $CsSnI_3$ perovskite layers prepared in Example 1 (thiosemicarbazide) and Comparative Example 4 (Comparative Example) of the present disclosure.

An XPS pattern of the inorganic lead-free $CsSnI_3$ perovskite layer prepared in step (3) of this example is shown in FIG. 4. The $CsSnI_3$ perovskite film passivated by thiosemicarbazide shows a significantly reduced vibration peak of $Sn^{4+}$, indicating that thiosemicarbazide could effectively inhibit the oxidation of divalent tin.

Figure 5:
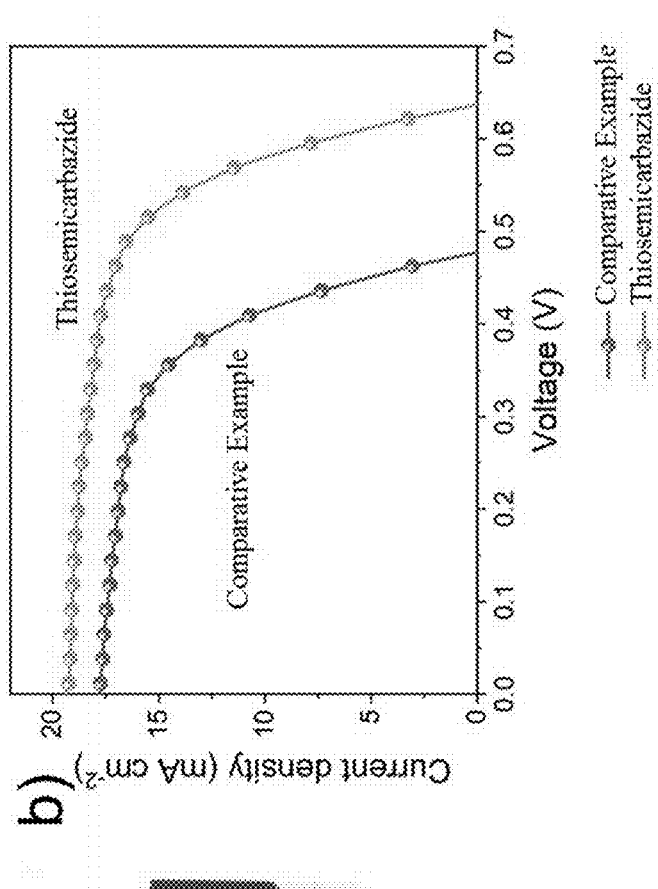
FIG. 5 shows a diagram (panel a) illustrating the structure model of the solar cell prepared in Example 1 of the present disclosure, and a diagram (panel b) illustrating the current density-voltage curves of the solar cells prepared in Example 1 (thiosemicarbazide) and Comparative Example 4 (Comparative Example) of the present disclosure.
Figure 5:
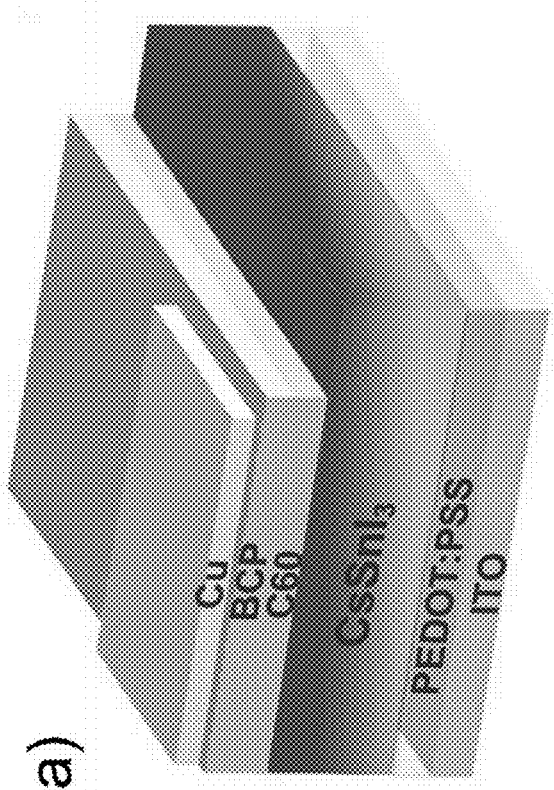

A structure model and a current density-voltage curve of the solar cell prepared in this example are shown in FIG. 5. It can be seen from FIG. 5 that the perovskite cell after thiosemicarbazide passivation has a significantly increased voltage, and an increased photoelectric conversion efficiency of 8.20%, which is much higher than that of Comparative Example 4 (5.06%)

Figure 6:
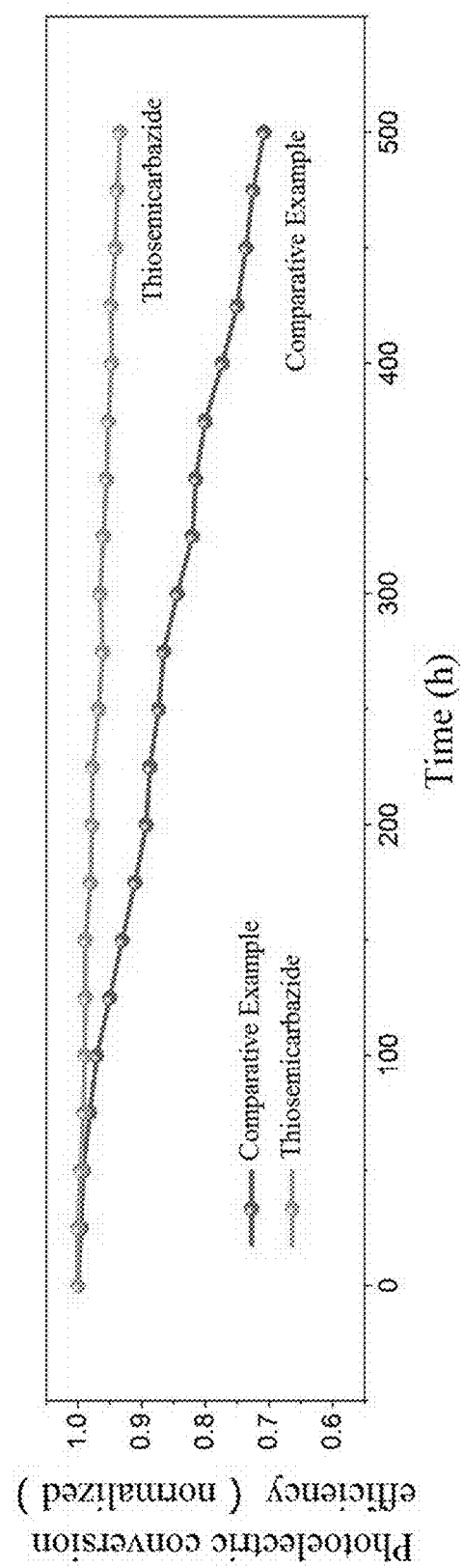
FIG. 6 is a diagram showing the stability test results of the solar cells prepared in Example 1 (thiosemicarbazide) and Comparative Example 4 (Comparative Example) of the present disclosure.

The solar cell prepared in this example was subjected to continuous light (AM1.5G) in the air to test its stability, and the test result is shown in FIG. 6. It can be seen from FIG. 6 that the perovskite cell passivated by thiosemicarbazide could still maintain about 90% of the initial photoelectric conversion efficiency after testing for 500 h, indicating that it has good long-term working stability.

EXAMPLE 2

A method for preparing an efficient and stable inorganic lead-free perovskite solar cell was conducted as described in Example 1, except that:

The metal counter electrode layer was an Au layer, which was prepared by a process as follows: under a pressure of lower than $1\times10^{-5}$ Pa, Au was evaporated at an evaporation rate of 0.5 nm/s and deposited on the BCP layer, obtaining the Au counter electrode layer with a thickness of 50 nm.

EXAMPLE 3

A method for preparing an efficient and stable inorganic lead-free perovskite solar cell was conducted as described in Example 1, except that:

In step (3), thiosemicarbazide was replaced with thiourea; the inorganic lead-free $CsSnI_3$ perovskite layer was prepared by a process as follows: three precursors, i.e. 1.2 mmol of $SnI_2$ (with a purity of 99.99%), 0.02 mmol of thiourea, and 1 mmol of CsI (with a purity of 99.9%), were respectively placed in three evaporation chambers of a vacuum thermal evaporation equipment, and under a vacuum degree of less than $1\times10^{-5}$ Pa, $SnI_2$ was firstly evaporated at a heating temperature of 350° C. and an evaporation rate of 0.2 nm/s until $SnI_2$ was exhausted, thiourea was then evaporated at a heating temperature of 100° C. and an evaporation rate of 0.2 nm/s until thiourea was exhausted, and finally, CsI was evaporated at a heating temperature of 600° C. and an evaporation rate of 0.5 nm/s until CsI was exhausted. The deposited product was transferred from the vacuum thermal evaporation equipment to a heating plate, and annealed at a temperature of 120° C. for 15 min, obtaining the inorganic lead-free $CsSnI_3$ perovskite layer with a thickness of 500 nm.

EXAMPLE 4

A method for preparing an efficient and stable inorganic lead-free perovskite solar cell was conducted as described in Example 1, except that:

In step (3), thiosemicarbazide is replaced with thioacetamide; the inorganic lead-free $CsSnI_3$ perovskite layer was prepared by a process as follows: three precursors, i.e. 1.2 mmol of $SnI_2$ (with a purity of 99.99%), 0.02 mmol of thioacetamide, and 1 mmol of CsI (with a purity of 99.9%), were respectively placed in three evaporation chambers of a vacuum thermal evaporation equipment, and under a vacuum degree of less than $1×10^{-5}$ Pa, $SnI_2$ was firstly evaporated at a heating temperature of 350° C. and an evaporation rate of 0.2 nm/s until $SnI_2$ was exhausted, thioacetamide was then evaporated at a heating temperature of 100° C. and an evaporation rate of 0.2 nm/s until thiourea was exhausted, and finally, CsI was evaporated at a heating temperature of 600° C. and an evaporation rate of 0.5 nm/s until CsI was exhausted. The deposited product was transferred from the vacuum thermal evaporation equipment to a heating plate, and annealed at a temperature of 120° C. for 15 min, obtaining the inorganic lead-free $CsSnI_3$ perovskite layer with a thickness of 500 nm.

EXAMPLE 5

A method for preparing an efficient and stable inorganic lead-free perovskite solar cell was conducted as described in Example 1, except that:

In step (3), the annealing was conducted at a temperature of 140° C. for 15 min.

Comparative Example 1

A method for preparing a solar cell was conducted as described in Example 1, except that:

In step (3), the annealing is conducted at a temperature of 60° C. for 15 min

Comparative Example 2

A method for preparing a solar cell was conducted as that described in Example 1, except that:

In step (3), the annealing was conducted at a temperature of 80° C. for 15 min.

The other steps and conditions were the same as those in Example 1.

Comparative Example 3

A method for preparing a solar cell was conducted as that described in Example 1, except that:

In step (3), the annealing was conducted at a temperature of 100° C. for 15 min.

Comparative Example 4

A method for preparing a solar cell was conducted as described in Example 1, except that:

In step (3), only CsI and $SnI_2$ were deposited (i.e. the step of depositing thiosemicarbazide was omitted), and an unpassivated $CsSnI_3$ perovskite layer was prepared by a process as follows: two precursors, i.e. 1.2 mmol of $SnI_2$ (with a purity of 99.99%) and 1 mmol of CsI (with a purity of 99.9%), were respectively placed in two evaporation chambers of a vacuum thermal evaporation equipment, and under a vacuum degree of less than $1'10^{-5}$ Pa, $SnI_2$ was firstly evaporated at a heating temperature of 350° C. and an evaporation rate of 0.2 nm/s until $SnI_2$ was exhausted, and finally, CsI was evaporated at a heating temperature of 600° C. and an evaporation rate of 0.5 nm/s until CsI was exhausted. The deposited product was transferred from the vacuum thermal evaporation equipment to a heating plate, and annealed at a temperature of 120° C. for 15 min, obtaining the unpassivated $CsSnI_3$ perovskite layer.

An SEM image of the $CsSnI_3$ perovskite layer without thiosemicarbazide passivation prepared in this comparative example is shown in FIG. 3 (panel a). It can be seen from FIG. 3 (panel a) that the inorganic $CsSnI_3$ perovskite without thiosemicarbazide has a smaller crystal grain size than that of the $CsSnI_3$ perovskite treated with thiosemicarbazide in Example 1 of the present disclosure.

An XPS pattern of the $CsSnI_3$ perovskite layer without thiosemicarbazide passivation prepared in this comparative example is shown in FIG. 4. It can be seen from FIG. 4 that the $CsSnI_3$ perovskite layer without thiosemicarbazide treatment shows a very obvious vibration peak of tetravalent tin, indicating an obvious oxidation.

A current density-voltage curve of the $CsSnI_3$ perovskite solar cell without thiosemicarbazide passivation prepared in this comparative example is shown in FIG. 5. It can be seen from FIG. 5 that this device has a photoelectric conversion efficiency of 5.06%, which is lower than that of the solar cell prepared in Example 1 of the present disclosure, further demonstrating the importance of surface passivation by a thioureas molecular in the present disclosure.

A result of stability test of the $CsSnI_3$ perovskite solar cell prepared in this comparative example without thiosemicarbazide passivation is shown in FIG. 6. It can be seen from FIG. 6 that after testing for 500 h, the photoelectric conversion efficiency of this device decays to less than 70% of the initial value, which is significantly lower than that of the solar cell prepared in Example 1 of the present disclosure, demonstrating that the surface passivation by a thioureas molecular in the present disclosure plays an important role in the stability of the $CsSnI_3$ perovskite solar cell.

Comparative Example 5

A method for preparing a solar cell was conducted as described in Example 1, except that:

In step (3), thiosemicarbazide is used in an amount of 0.01 mmol, i.e. the amount of thiosemicarbazide accounts for 1% of $CsSnI_3$ (i.e. a molar amount of CsI).

An XRD pattern of the $CsSnI_3$ perovskite layer passivated with a small amount of thiosemicarbazide (1% of thiosemicarbazide) prepared in this comparative example is shown in FIG. 2. It can be seen from FIG. 2 that the inorganic $CsSnI_3$ perovskite treated with a small amount of thiosemicarbazide has not been completely reacted, and a few of unreacted perovskite precursors $SnI_2$ and CsI are still present.

Comparative Example 6

A method for preparing a solar cell was conducted as described in Example 1, except that:

In step (3), thiosemicarbazide is used in an amount of 0.05 mmol, i.e. the amount of thiosemicarbazide accounts for 5% of $CsSnI_3$ (i.e. a molar amount of CsI).

An XRD pattern of the $CsSnI_3$ perovskite layer passivated with excess thiosemicarbazide (5% of thiosemicarbazide) prepared in this comparative example is shown in FIG. 2. It can be seen from FIG. 2 that the inorganic $CsSnI_3$ perovskite treated with excess thiosemicarbazide is not formed.

What is claimed is:

1. An efficient and stable inorganic lead-free perovskite solar cell, comprising a conductive substrate, a poly (3,4-ethylenedioxythiophene)-poly (styrene sulfonate) layer, an inorganic lead-free $CsSnI_3$ perovskite layer, a fullerene layer, a bathocuproine layer, and a metal counter electrode layer arranged in order from bottom to top, wherein the inorganic lead-free $CsSnI_3$ perovskite layer is a $CsSnI_3$ perovskite layer passivated by a thioureas small-molecule organic compound.

2. The efficient and stable inorganic lead-free perovskite solar cell of claim 1, wherein the conductive substrate is an indium tin oxide conductive glass substrate.

3. The efficient and stable inorganic lead-free perovskite solar cell of claim 1, comprising one or more of the following features:
   i. the conductive substrate has an electrical resistance of less than 6 ohm/sq, and a thickness of 140-160 nm;
   ii. the poly (3,4-ethylenedioxythiophene)-poly (styrene sulfonate) layer has a thickness of 20-40 nm;
   iii. the inorganic lead-free $CsSnI_3$ perovskite layer has a thickness of 400-500 nm;
   iv. the fullerene layer has a thickness of 30-50 nm;
   v. the bathocuproine layer has a thickness of 5-10 nm; and
   vi. the metal counter electrode layer has a thickness of 50-70 nm.

4. The efficient and stable inorganic lead-free perovskite solar cell of claim 1, wherein the thioureas small-molecule organic compound is selected from the group consisting of thiourea, thiosemicarbazide, and thioacetamide.

5. The efficient and stable inorganic lead-free perovskite solar cell of claim 1, wherein the inorganic lead-free $CsSnI_3$ perovskite layer is prepared by a process comprising:
   sequentially depositing $SnI_2$, the thioureas small-molecule organic compound, and CsI on the poly (3,4-ethylenedioxythiophene)-poly (styrene sulfonate) layer, and then annealing to obtain the inorganic lead-free $CsSnI_3$ perovskite layer.

6. The efficient and stable inorganic lead-free perovskite solar cell of claim 1, wherein a metal counter electrode in the metal counter electrode layer is copper counter electrode or gold counter electrode.

7. A method for preparing the efficient and stable inorganic lead-free perovskite solar cell of claim 1, comprising the following steps:
   (1) pretreating the conductive substrate;
   (2) spin-coating a poly (3,4-ethylenedioxythiophene)-poly (styrene sulfonate) aqueous solution on the conductive substrate, and annealing to obtain the poly (3,4-ethylenedioxythiophene)-poly (styrene sulfonate) layer;
   (3) using $SnI_2$, the thioureas small-molecule organic compound and CsI as raw materials, depositing $SnI_2$, the thioureas small-molecule organic compound, and CsI on the poly (3,4-ethylenedioxythiophene)-poly (styrene sulfonate) layer in sequence by a vacuum thermal evaporation, and then annealing to obtain an inorganic lead-free $CsSnI_3$ perovskite layer; and
   (4) sequentially depositing a fullerene layer, a bathocuproine layer and a metal counter electrode layer on the inorganic lead-free $CsSnI_3$ perovskite layer by a vacuum thermal evaporation to obtain an inorganic lead-free perovskite solar cell.

8. The method of claim 7, wherein the method is conducted under conditions comprising one or more of the following items:
   i. in step (1), the conductive substrate is pretreated as follows: etching, washing, and drying the conductive substrate, and finally subjecting the conductive substrate to an ultraviolet ozone treatment;
   ii. in step (2), the poly (3,4-ethylenedioxythiophene)-poly (styrene sulfonate) aqueous solution is spin coated on the conductive substrate using a spin coater at a spin-coating speed of 2000-3000 rpm for 30-40 s; and
   iii. in step (2), the annealing is conducted at a temperature of 80-120° C. for 5-15 min.

9. The method of claim 7, wherein step (3) is conducted under conditions comprising one or more of the following items:
   i. the thermal vacuum evaporation is conducted at a vacuum degree of less than $1\times10^{-5}$ Pa, during which $SnI_2$ is evaporated at a heating temperature of 300-350° C. and an evaporation rate of 0.1-0.2 nm/s, the thioureas small-molecule organic compound is evaporated at a heating temperature of 70-100° C. and an evaporation rate of 0.1-0.2 nm/s, and CsI is evaporated at a heating temperature of 550-600° C. and an evaporation rate of 0.2-0.5 nm/s;
   ii. a molar ratio of CsI to $SnI_2$ is in a range of 1: (1-1.3), a molar ratio of the thioureas small-molecule organic compound to CsI is in a range of 1: (45-55), a molar ratio of CsI to $SnI_2$ is 1:1.2, and a molar ratio of the thioureas small-molecule organic compound to CsI is 1:50;
   iii. CsI has a purity of 99.9%, and $SnI_2$ has a purity of 99.99%; and
   iv. the annealing is conducted at a temperature of 120-140° C. for 10-20 min.

10. The method of claim 7, wherein step (4) is conducted as follows:
   under a vacuum degree of less than $1\times10^{-5}$ Pa, evaporating fullerene at an evaporation rate of 0.1-0.3 nm/s, and depositing on the inorganic lead-free $CsSnI_3$ perovskite layer to obtain a fullerene layer; then evaporating bathocuproine at an evaporation rate of 0.05-0.3 nm/s, and depositing on the fullerene layer to obtain a bathocuproine layer; finally evaporating a metal at an evaporation rate of 0.2-0.7 nm/s, and depositing on the bathocuproine layer to obtain an inorganic lead-free perovskite solar cell.

* * * * *